(12) United States Patent
Takakusaki et al.

(10) Patent No.: US 7,521,290 B2
(45) Date of Patent: Apr. 21, 2009

(54) METHOD OF MANUFACTURING CIRCUIT DEVICE

(75) Inventors: Sadamichi Takakusaki, Gunma (JP); Noriaki Sakamoto, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 274 days.

(21) Appl. No.: 11/622,198

(22) Filed: Jan. 11, 2007

(65) Prior Publication Data
US 2007/0193027 A1 Aug. 23, 2007

(30) Foreign Application Priority Data
Feb. 22, 2006 (JP) .............................. 2006-044882

(51) Int. Cl.
H01L 21/50 (2006.01)
H01L 21/48 (2006.01)
H01L 21/44 (2006.01)

(52) U.S. Cl. ...................... 438/111; 438/110; 438/112; 438/123; 438/106

(58) Field of Classification Search ................. 438/110, 438/111, 112, 123, 106; 257/723, 724, 668, 257/666, 670, 677
See application file for complete search history.

(56) References Cited

U.S. PATENT DOCUMENTS

| | | | | |
|---|---|---|---|---|
| 5,184,207 A | * | 2/1993 | Cain | ........................... 257/668 |
| 5,184,285 A | * | 2/1993 | Murphy et al. | .............. 361/813 |
| 5,352,633 A | * | 10/1994 | Abbott | ........................ 156/233 |
| 5,384,286 A | * | 1/1995 | Hirai | ............................. 29/827 |
| 5,778,520 A | * | 7/1998 | Kim et al. | ..................... 29/827 |
| 5,822,848 A | * | 10/1998 | Chiang | ........................ 438/106 |
| 2003/0003630 A1 | | 1/2003 | Iimura et al. | |

FOREIGN PATENT DOCUMENTS

| | | |
|---|---|---|
| CN | 1395301 | 2/2003 |
| JP | 05-102645 | 4/1993 |

* cited by examiner

Primary Examiner—Luan C Thai
(74) Attorney, Agent, or Firm—Fish & Richardson P.C.

(57) ABSTRACT

The method of the present invention includes a first step of preparing a substrate in which a plurality of circuit boards are integrally connected to one another, each of the circuit boards having conductive patterns which include pads formed on a surface of the circuit board; a second step of electrically connecting circuit elements to the respective conductive patterns on each of the circuit boards; a third step of positioning ends of leads above the respective pads by superposing a lead frame including the plurality of leads on the substrate, and fixing the leads to the pads; and a fourth step of separating the circuit boards from the substrate in a state where the leads are fixed to the respective pads on each of the circuit boards, and thus separating the leads from the lead frame.

6 Claims, 5 Drawing Sheets

METHOD OF MANUFACTURING CIRCUIT DEVICE

Priority is claimed to Japanese Patent Application Number JP2006-44882 filed on Feb. 22, 2006, the disclosures of which are incorporated herein by reference in its entirety.

BACKGROUND OF THE INVENTION

1. Field of the Invention

The present invention relates to a method of manufacturing a circuit device, and more particularly relates to a method of manufacturing a circuit device including leads which function as external terminals.

2. Description of the Related Art

With reference to FIG. 5, a configuration of a conventional hybrid integrated circuit device 100 will be described. This technology is described for instance in Japanese Patent Application No. Hei 5 (1993)-102645. Conductive patterns 103 are formed on a surface of a rectangular substrate 101 with an insulating layer 102 interposed therebetween. Each of circuit elements is fixed to a desired spot in a corresponding one of the conductive patterns 103 to form a predetermined electric circuit. Here, as the circuit elements, a semiconductor element 105A and a chip element 105B are respectively connected to the conductive patterns 103. Each of leads 104 is connected to a corresponding one of pads 109, which are formed in a peripheral portion of the substrate 101, and which are respectively made of the conductive patterns 103, and functions as an external terminal. A sealing resin 108 has a function of sealing the electric circuit formed on the surface of the substrate 101. The hybrid integrated circuit device 100 thus configured makes it possible to actively release heat generated from the semiconductor element 105A and the like to the outside through the substrate 101. Thus, the device has excellent heat release properties.

The hybrid integrated circuit device 100 described above is manufactured in the following manner. First, the conductive patterns 103 are patterned on the surface of the substrate 101 made of metal such as aluminum. Next, the semiconductor element 105A and the chip element 105B are fixed, and electrically connected, respectively to predetermined spots in the conductive patterns 103. Furthermore, the leads 104 are fixed to the respective pads 109 each made of the conductive pattern 103. Lastly, the sealing resin 108 is formed on the surface of the substrate 101 in a manner that the circuit elements including the semiconductor element 105A and the like are covered with the sealing resin 108.

However, the above method of manufacturing a hybrid integrated circuit device has a problem that positioning of the leads 104 is troublesome.

Specifically, details of the step of fixing the leads 104 are as follows. First, a jointing material such as solder is applied onto a surface of each of the pads 109 formed on the surface of the substrate 101. Next, a position of a tip of each of the leads 104 is aligned with the surface of a corresponding one of the pads 109. Furthermore, the solder on each of the pads 109 is melted by use of a reflow furnace or the like, and thus the leads 104 are fixed to the respective pads 109.

Accordingly, in the above step, it is necessary to position the tip of each of the leads 104 to the top of a corresponding one of the pads 109, and to hold the lead 104 at a predetermined position until the solder is melted and solidified. As a result, it takes a lot of trouble to fix the leads 104.

By using a lead frame having a plurality of leads 104 connected thereto, the leads 104 can be collectively positioned thereto. Thus, the positioning of the leads 104 can be facilitated. However, even in a case where the lead frame is used, the lead frame is required to be positioned to the substrate, and equivalent work is required to be done. For this reason, it is expensive to position the leads 104.

SUMMARY OF THE INVENTION

The present invention has been made in consideration of the foregoing problems. The main object of the present invention is to provide a method of manufacturing a circuit device of which manufacturing costs are reduced by simplifying a step of fixing leads respectively to pads on a circuit board.

A method of manufacturing a circuit device according to the present invention is a method of manufacturing a circuit device in which electric circuits each including conductive patterns and circuit elements are mounted respectively on surfaces of circuit boards, and in which leads are fixed respectively to pads each made of the conductive pattern. The method includes a first step of preparing a substrate in which the plurality of the circuit boards are integrally connected to one another, each of the circuit boards having the conductive patterns including the pads formed on the surface of the circuit board; a second step of electrically connecting each of the circuit elements to a corresponding one of the conductive patterns on each of the circuit boards; a third step of positioning ends of the plurality of leads above the respective pads by superposing a lead frame, which includes the leads, on the substrate, and of fixing the leads to the respective pads; and a fourth step of separating the circuit boards from the substrate in a state where the leads are fixed to the respective pads on each of the circuit boards, and of thus separating the leads from the lead frame.

In the method of manufacturing a circuit device according to the present invention, in the third step, the lead frame is superposed on the substrate, and the substrate and the lead frame are aligned with, and connected to, each other by fitting alignment pins into first alignment holes provided in a manner that the first alignment holes penetrate the lead frame, and by fitting the alignment pins into second alignment holes provided in a manner that the second alignment holes penetrate the substrate.

In the method of manufacturing a circuit device according to the present invention, the planar size of the substrate is substantially equal to that of the lead frame.

In the method of manufacturing a circuit device according to the present invention, in the fourth step, each of the circuit boards and the corresponding leads are separated from each other by punching.

In the method of manufacturing a circuit device according to the present invention, in the third step, the lead frame is attached to the substrate with an insulating layer in a B stage state interposed therebetween, the insulating layer covering the surface of the substrate.

In the method of manufacturing a circuit device according to the present invention, at least the surfaces of the circuit boards are sealed in a state where the substrate and the lead frame are connected to each other.

DESCRIPTION OF THE EMBODIMENTS

First Embodiment

In a first embodiment, descriptions will be provided for a structure of a hybrid integrated circuit device 10 as an example of a circuit device.

Figure 1A:
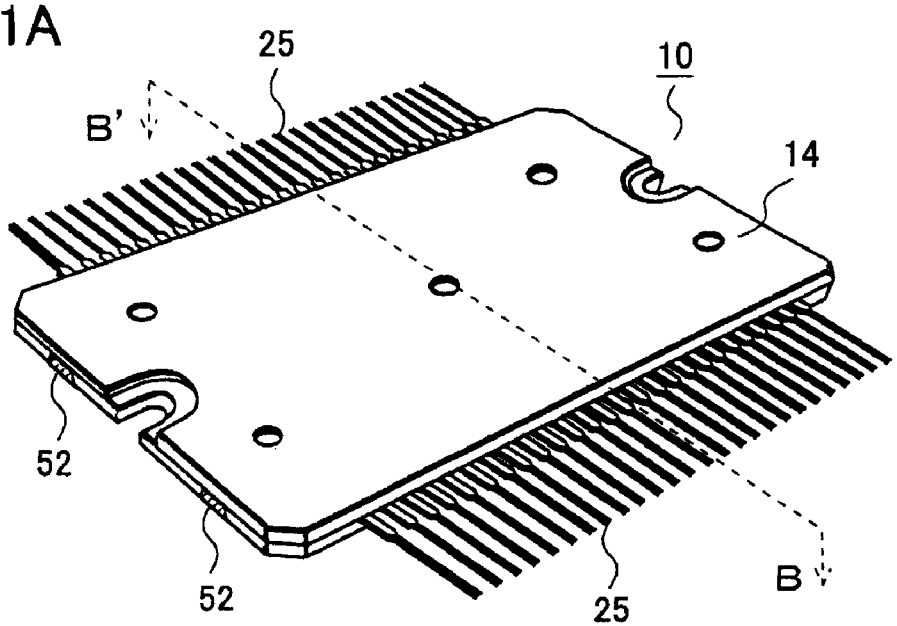
FIGS. 1A and 1B are perspective views showing a circuit device of a preferred embodiment of the present invention.
Figure 1B:
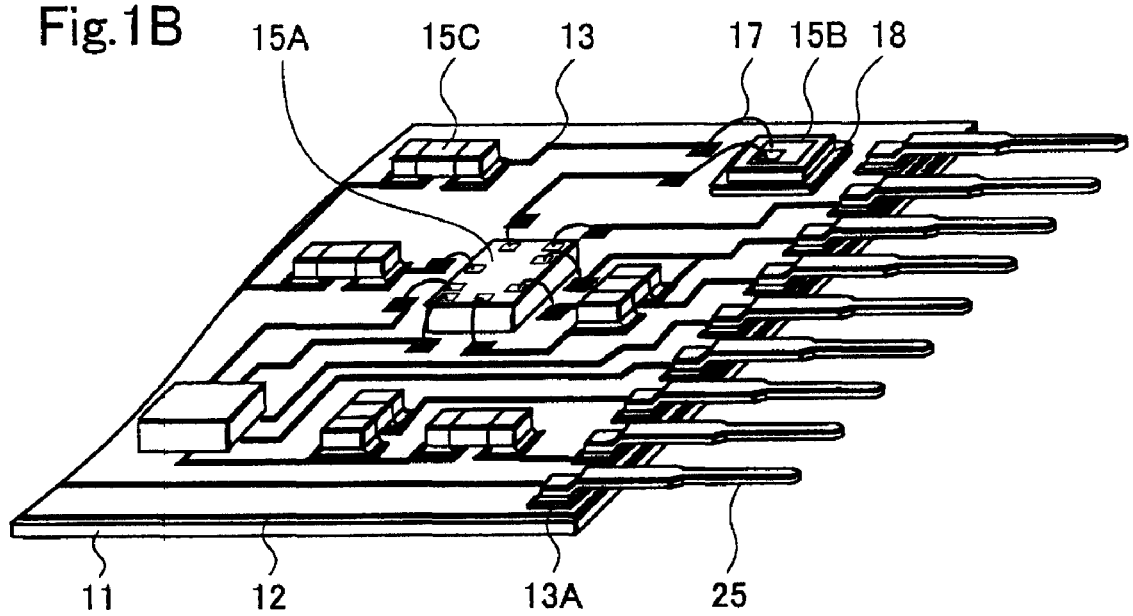

With reference to FIGS. 1A and 1B, descriptions will be provided for a configuration of the hybrid integrated circuit device 10 of the preferred embodiment of the present invention. FIG. 1A is a perspective view of the hybrid integrated circuit device 10 viewed from obliquely above. FIG. 1B is a perspective view of the hybrid integrated circuit device 10 without a sealing resin 14 for sealing the entire device.

With reference to FIGS. 1A and 1B, the hybrid integrated circuit device 10 of this embodiment includes a circuit board 11; conductive patterns 13 formed on a surface of the circuit board 11; each of circuit elements including a semiconductor element 15A and the like, which is fixed to a corresponding one of the conductive patterns 13; and leads 25 fixed to pads 13A respectively made of the conductive patterns 13. Specifically, on the upper surface of the circuit board 11, an electric circuit is mounted. The electric circuit includes the conductive patterns 13 and the circuit elements, and has predetermined functions. Moreover, the leads 25, which is connected to the electric circuit formed on the surface of the circuit board, are drawn out to the outside from the sealing resin 14.

The circuit board 11 is a metal board mainly made of metal such as aluminum (Al) or copper (Cu). A specific size of the circuit board 11 is, for example, about 60 mm in length, 30 mm in width and 1.5 mm in thickness. In a case where a board made of aluminum is adopted as the circuit board 11, oxide films are formed on both principal surfaces of the circuit board 11, and are subjected to alumite treatment.

Side faces of the circuit board 11 have different shapes depending on manufacturing methods. Specifically, in a case where the circuit board 11 is manufactured by punching using a pressing machine, a circuit board 11A has straight side faces. Meanwhile, in a case where the circuit board 11 is manufactured by forming V-shaped dicing grooves, the circuit board 11A has inclined side faces protruding outward.

An insulating layer 12 is formed in a manner that the entire upper surface of the circuit board 11 is covered with the insulating layer 12. The insulating layer 12 is made of an epoxy resin or the like, which is highly filled with fillers such as $Al_2O_3$, and thermal resistance thereof is reduced. Hence, heat generated from the included circuit elements can be actively transmitted to the circuit board 11 through the insulating layer 12 having the reduced thermal resistance. A specific thickness of the insulating layer 12 is, for example, about 50 μm. A back surface of the circuit board 11 may also be covered with the insulating layer 12. By covering the back surface as described above, the back surface of the circuit board 1 can be insulated from the outside even when the back surface thereof is exposed to the outside from the sealing resin 14.

Each of the conductive patterns 13 is made of metal such as copper, and is formed on a surface of the insulating layer 12 to form a predetermined electric circuit. Moreover, the pads 13A respectively made of the conductive patterns 13 are formed on a side of which the leads 25 are drawn out. Furthermore, a number of pads made of the respective conductive patterns 13 are also formed around the semiconductor element 15A. The pads and the semiconductor element 15A are connected to each other through thin metal wires 17. Here, FIG. 1B shows the conductive patterns 13 each having a single layer. However, the conductive patterns 13 each having two layers or more may be formed on the upper surface of the circuit board 11 with the insulating layer interposed therebetween.

As the circuit elements mounted on the circuit board 11, active elements or passive elements can be generally adopted. To be more specific, a transistor, an LSI chip, a diode, a chip resistor, a chip capacitor, an inductance, a thermistor, an antenna, an oscillator and the like can be adopted as the circuit elements. Furthermore, as the circuit element, a resin-sealed package or the like can also be fixed to one of the conductive patterns 13. FIG. 1B shows a chip element 15C and semiconductor elements 15A and 15B as the circuit elements.

One ends of the leads 25 are electrically connected to the respective pads 13A on the circuit board 11, and the other ends thereof are drawn out to the outside from the sealing resin 14. The leads 25 are made of metal mainly made of copper (Cu), aluminum (Al), Fe—Ni alloy or the like. In this event, the leads 25 are respectively connected to the pads 13A provided along two opposite sides of the circuit board 11. However, the plurality of pads 13A may be provided along one side, or four sides, of the circuit board 11, and the leads 25 may be respectively connected to the pads 13A.

The sealing resin 14 is formed by transfer molding using a thermosetting resin, or by injection molding using a thermoplastic resin. Here, the entire circuit board 11 including also the back surface thereof may be covered with the sealing resin 14, or the back surface of the circuit board 11 may be exposed from the sealing resin 14.

Figure 2A:
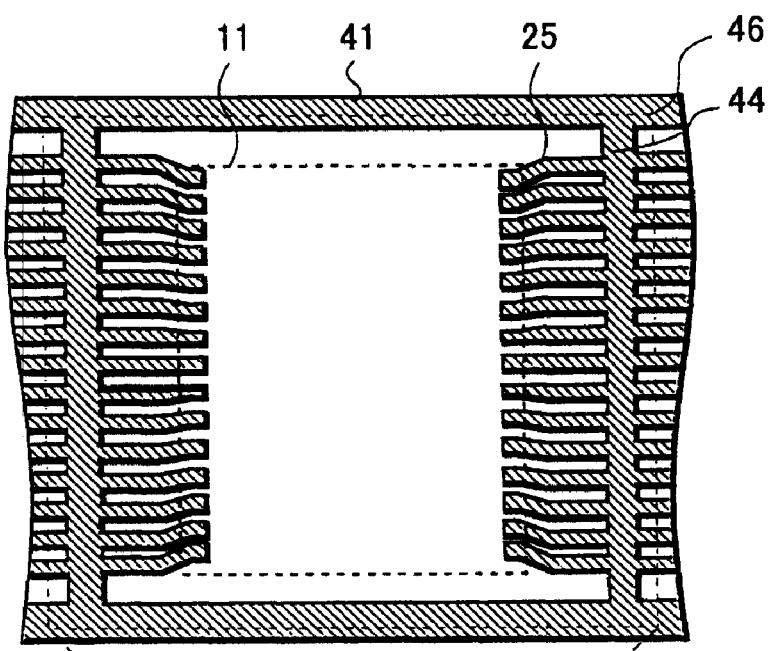
FIGS. 2A to 2C are plan views.
Figure 2B:
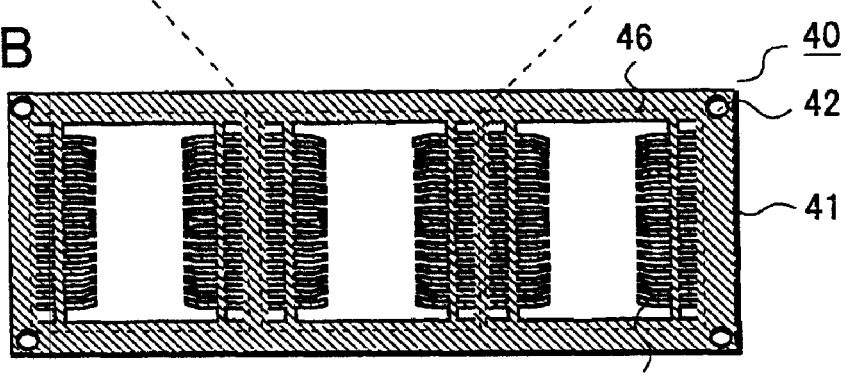
Figure 2C:
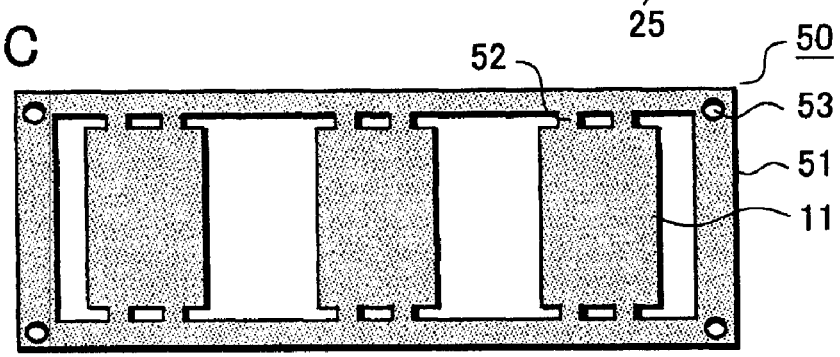

Furthermore, in the first embodiment, with reference to FIG. 1A, connection parts 52, which are parts of the circuit board 11, are exposed from a side face of the sealing resin 14 for sealing the entire device. With reference to FIG. 2C, the connection parts 52 are provided, for example, to connect the plurality of circuit boards 11 to an outer frame 51 of a large substrate 50. This matter will be described in detail with reference to FIGS. 2A to 2D.

Second Embodiment

In a second embodiment, with reference to FIGS. 2A to 4B, a method of manufacturing a hybrid integrated circuit device will be described. With reference to FIGS. 2A to 2D, descriptions will be first provided for a lead frame 40 and a substrate 50, which are used in the second embodiment.

First, with reference to FIGS. 2A and 2B, a configuration of the lead frame 40 used in the second embodiment will be described. FIG. 2A is an enlarged plan view of one of units 46 provided in the lead frame 40. FIG. 2B is a cross-sectional view showing the entire lead frame 40.

The lead frame 40 is formed by pressing or etching a metal plate mainly made of copper or aluminum having a thickness of, for example, about 0.5 mm. With reference to FIG. 2A, the unit 46 includes a number of leads 25. One end of each of the leads 25 is positioned within a region in which a circuit board 11 is placed. In FIG. 2A, a periphery of the region, in which the circuit board 11 is placed, is indicated by a dotted line.

Here, in the page space for FIG. 2A, the leads 25 are horizontally extended toward the region, in which the circuit board is placed, from right and left sides of the unit 46. Furthermore, the plurality of leads 25 are connected to one another by a tie bar 44 extended from an outer frame 41. Thus, deformation of the leads in the middle of a manufacturing process is prevented. In the second embodiment, since the ends of the respective leads 25 are fixed to the upper surface of the circuit board 11, tips of the leads 25 are extended to a region inside the circuit board 11.

With reference to FIG. 2B, in the lead frame 40 having a strip shape, the plurality of units 46 having the configuration as described above are disposed with spaces between each of the units 46. Here, the three units 46 are disposed in the lead frame 40. In the second embodiment, the hybrid integrated circuit device is manufactured by providing the plurality of units 46 in the lead frame 40. Thus, fixing of the leads 25, a molding step and the like are collectively performed, and productivity is improved.

In the outer frame 41 of the lead frame 40, first alignment holes 42 are provided. The first alignment holes 42 penetrate the lead frame 40 in the thickness direction thereof. In this event, four first alignment holes 42 are formed near four corners of the lead frame 40. The first alignment holes 42 are large enough to insert alignment pins 54 to be described later, and are used for aligning the substrate 50 and the lead frame 40 with each other. Here, FIG. 2B shows the circular first alignment holes 42. However, the first alignment holes 42 may have, for example, a polygonal shape such as a square shape.

With reference to FIG. 2C, descriptions will be provided for the substrate 50 in which the numerous circuit boards 11 are provided. A planar external shape of the substrate 50 is a strip shape having a size which is substantially equal to that of the lead frame 40 described above. The substrate 50 is formed by pressing or etching metal mainly made of copper or aluminum having a thickness of about 1.5 mm. The plurality of circuit boards 11 are positioned inside the substrate 50, and the respective circuit boards 11 are integrally connected to an outer frame 51 through connection parts 52. Here, in the page space for FIG. 2C, an upper side of each of the circuit boards 11 is fixed to the outer frame 51 through two of the connection parts 52. Furthermore, each of lower sides of the corresponding one of the circuit boards 11 is also fixed to the outer frame 51 through two of the connection parts 52.

Here, as in the case of the lead frame 40 shown in FIG. 2B, the three circuit boards 11 are provided inside the substrate 50. Positions of the units 46 provided in the lead frame 40 and positions of the circuit boards 11 accurately correspond to each other. Specifically, when the lead frame 40 is superposed on the substrate 50, the tips of the leads 25 provided in the units 46 in the lead frame 40 are positioned on the upper surfaces of the circuit boards 11 in the substrate 50.

Near four corners of the substrate 50, second alignment holes 53 are formed. The second alignment holes 53 are provided in a manner that the second alignment holes 53 penetrate the substrate 50. The second alignment holes 53 respectively have the planar positions and the sizes which are equal to those of the first alignment holes 42 provided in the lead frame 40.

Figure 2D:
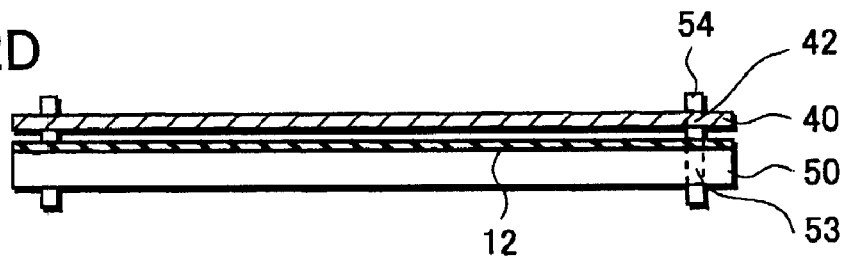
FIG. 2D is a cross-sectional view, showing a method of manufacturing a circuit device according to the preferred embodiment of the present invention.

With reference to FIG. 2D, in the second embodiment, the lead frame 40 and the substrate 50, which are configured as described above, are connected to each other by superposing the lead frame 40 on the substrate 50. The alignment pins 54 made of metal such as iron or aluminum are inserted (fitted) into both of the first alignment holes 42 in the lead frame 40 and the second alignment holes 53 in the substrate 50. The alignment pins 54 are inserted into all of the four first alignment holes 42 and the four second alignment holes 53.

As described above, by fitting the alignment pins 54 into the first alignment holes 42 and the second alignment holes 53, relative positions of the substrate 50 and the lead frame 40 can be accurately adjusted. Specifically, the tips of the leads 25 in the lead frame 40 can be set in the respective positions where unillustrated pads are disposed, on each of the surfaces of the circuit boards 11 in the substrate 50.

In the second embodiment, the lead frame 40 and the substrate 50 can be set in a connected state by use of the alignment pins 54. Thus, since the lead frame 40 and the substrate 50 are set to be an integrated plate-like body, the lead frame 40 and the substrate 50 can be easily transported. Furthermore, since the tips of the leads 25 are positioned respectively on the pads on the circuit boards 11 only by superposing the lead frame 40 on the substrate 50, the leads 25 can be accurately and easily positioned.

The surface of the substrate 50 is covered with an insulating layer 12 made of an epoxy resin filled with inorganic fillers such as alumina. Moreover, in the step of superposing the lead frame 40 on the substrate 50, the insulating layer 12 is preferably in a B stage (partially cured) state. This is because the lead frame 40 and the substrate 50 can be bonded to each other by use of adhesion of the insulating layer 12 in the B stage.

Figure 3A:
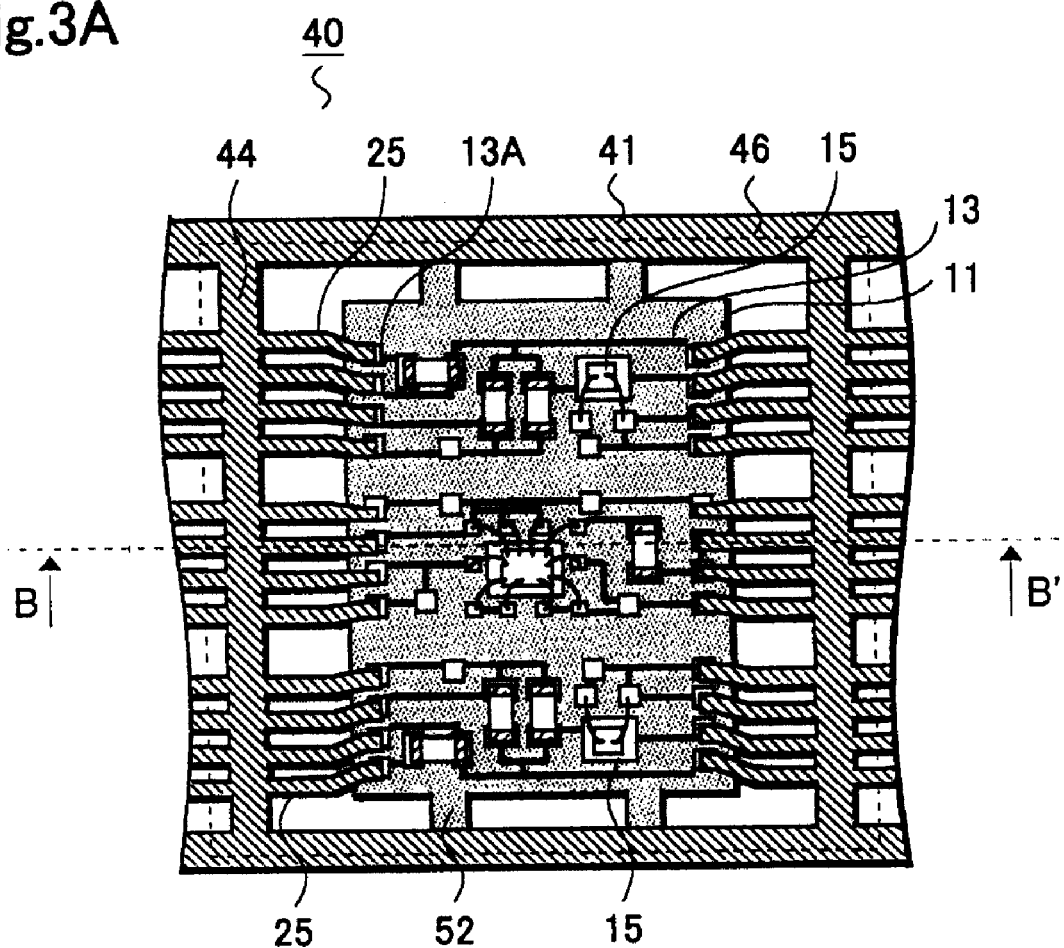
FIG. 3A is a plan view.
Figure 3B:
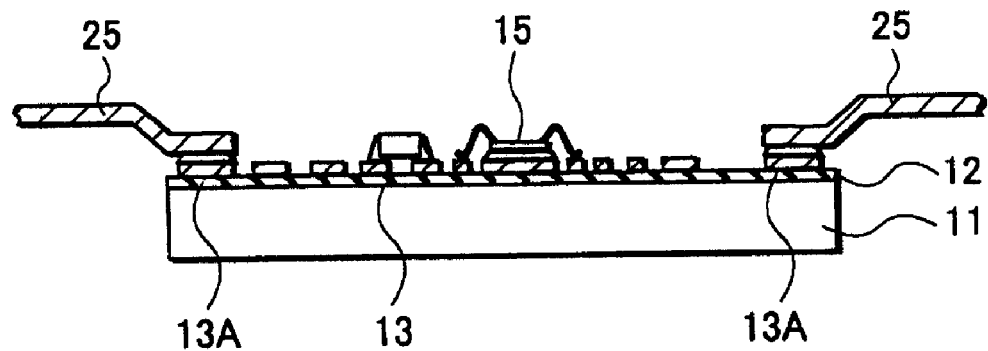
FIG. 3B is a cross-sectional view, showing the method of manufacturing a circuit device according to the preferred embodiment of the present invention.

With reference to FIGS. 3A and 3B, descriptions will be provided for a configuration of the unit 46 in a state after the lead frame 40 is superposed on the substrate 50. FIG. 3A is a plan view of one of the units 46 viewed from above. FIG. 3B is a cross-sectional view taken along the line B-B' in FIG. 3A.

Inside each of the units 46, the circuit board 11 is disposed, and the tips of the leads 25 extended inward from right and left sides of the unit 46 are positioned above pads 13A formed on the surface of the circuit board 11.

The above-described superposition of the lead frame 40 and the substrate 50 may be performed after the circuit elements such as the semiconductor element are disposed on the surface of the circuit board 11, and the circuit elements and conductive patterns 13 are respectively connected to each other through the thin metal wires. Furthermore, the lead frame 40 may also be superposed on the substrate 50 before the circuit elements such as the semiconductor element are disposed on the surface of the circuit board 11.

The leads 25 and the pads 13A are connected to each other in the following manner. First, the lead frame 40 is superposed on the substrate 50, and the tips of the leads 25 are respectively positioned above the pads 13A. Next, by melting solder or solder cream previously formed on surfaces of the pads 13A, the tips of the leads 25 are fixed to the respective surfaces of the pads 13A. In the second embodiment, as described above, by superposing the lead frame 40 on the substrate 50, the tips of the leads 25 can be positioned above the respective pads 13A in each of the numerous units 46. Accordingly, in the step of connecting the leads 25 to the respective pads 13A by melting solder, jigs for holding the leads 25 are not needed.

In the background art described above, alignment between the circuit board 11 and the leads 25 is needed for each of the circuit boards 11. In this embodiment, as described above, by superposing the lead frame 40 and the substrate 50 as a pair, the leads 25 can be disposed in the respective predetermined positions in the plurality of circuit boards 11, and can be fixed thereto. Thus, efforts required to position and to fix the leads 25 are significantly reduced. Consequently, manufacturing costs can be reduced.

Figure 4A:
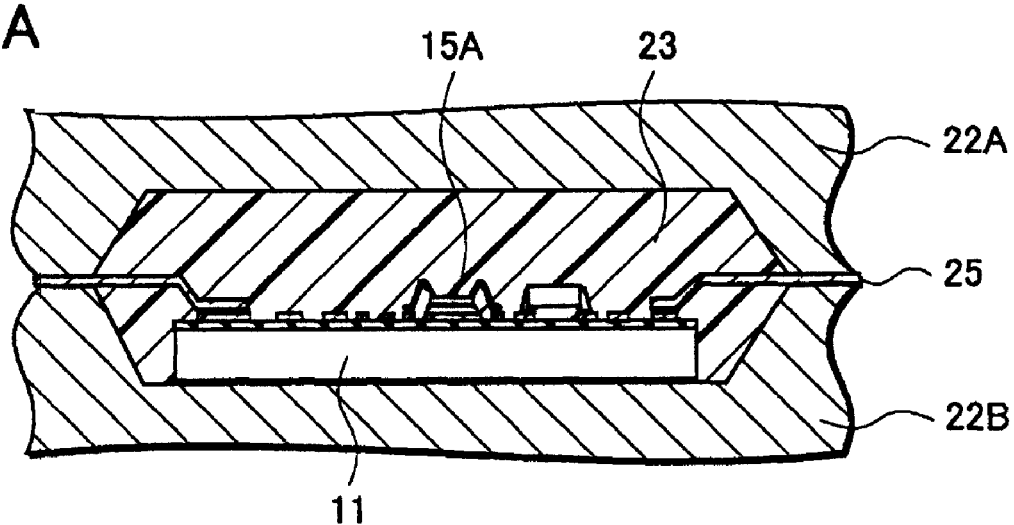
FIG. 4A is a cross-sectional view and FIG. 4B is a plan view showing the method for manufacturing a circuit device according to the preferred embodiment of the present invention.
Figure 4B:
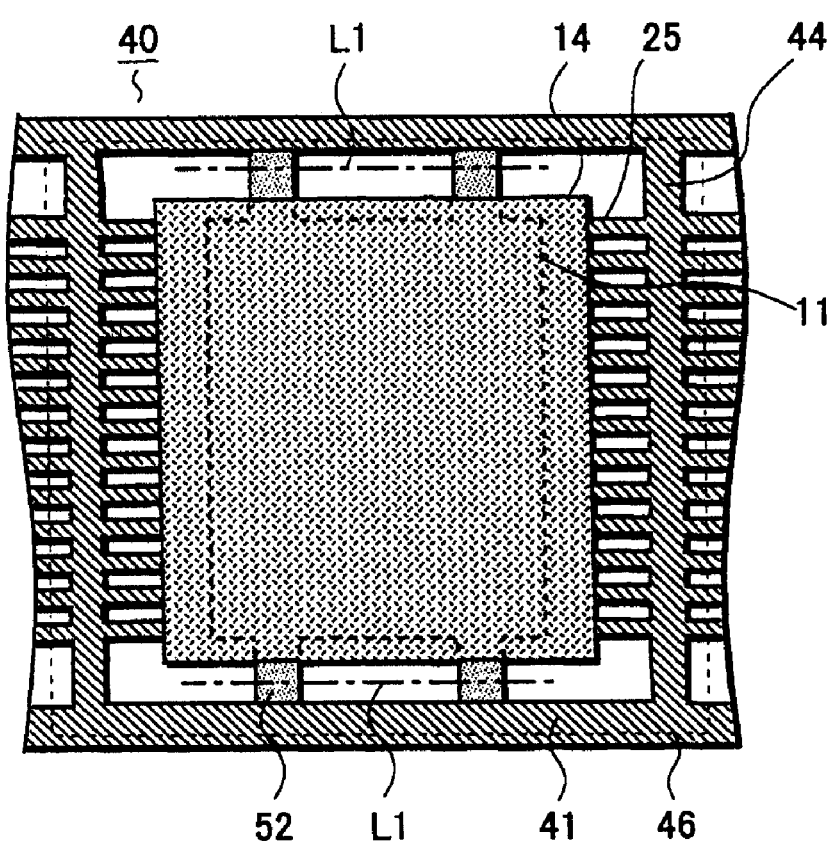
Figure 5:
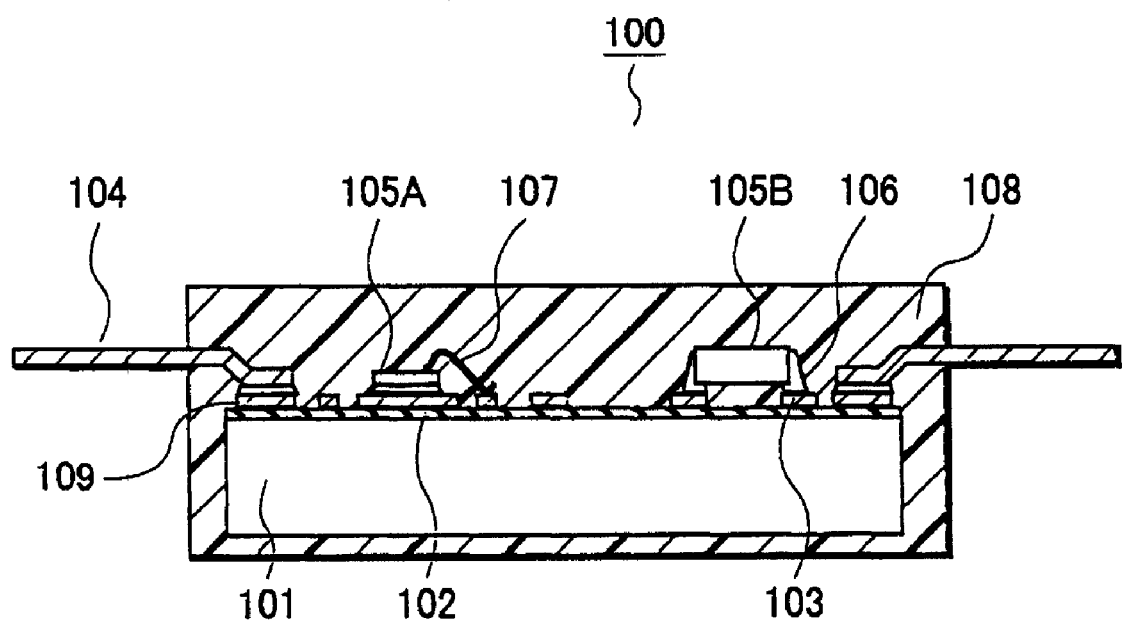
FIG. 5 is a cross-sectional view showing a conventional hybrid integrated circuit device.

With reference to FIGS. 4A and 4B, a sealing resin 14 is subsequently formed in a manner that at least the surface of the circuit board 11 is covered with the sealing resin 14, and the circuit board 11 having the leads 25 fixed thereto is separated. FIG. 4A is a cross-sectional view showing this step, and FIG. 4B is a plan view of the unit 46 in a state after a sealing step is performed.

With reference to FIG. 4A, a position of the circuit board 11 inside a cavity 23 is fixed by causing an upper mold 22A and a lower mold 22B to be in contact with the leads 25. Thereafter, by injecting a resin into the cavity 23 through a gate (not shown) provided in the mold, the circuit board 11 is sealed. Moreover, as the sealing resin is injected into the cavity 23, air inside the cavity 23 is released to the outside through the unillustrated gate. In this step, transfer molding using a thermosetting resin or injection molding using a thermoplastic resin is performed. Furthermore, in this step, a method of forming the sealing resin 14 only on the surface of the circuit board 11 by potting the sealing resin or sealing by use of a case material can also be adopted.

In this step, the plurality of circuit boards 11 formed in the substrate 50 shown in FIG. 2C are collectively sealed. Thus, the sealing step can be simplified. Moreover, by holding and fixing the outer frame 51 of the substrate 50 shown in FIG. 2C between the upper and lower molds 22A and 22B, the position of the circuit board 11 inside the cavity 23 can be fixed. Hence, even when the resin is injected at high pressure into the cavity 23, it is made possible to prevent the circuit board 11 from being moved by the pressure of the resin.

With reference to FIG. 4B, after the molding step described above is completed, the leads 25 are separated from the lead frame 40. Moreover, the individual circuit boards 11 are also separated from the substrate 50. Here, since the substrate 50, in which the plurality of circuit boards 11 are formed, is positioned below the lead frame 40, the substrate is not shown in FIG. 4B.

To be more specific, the leads 25 are individually separated in a position where the tie bar 44 is provided. The connection parts 52 are separated in a position of a separation line L1 indicated by a dashed line in FIG. 4, for example, and the hybrid integrated circuit device 10 as shown in FIGS. 1A and 1B is separated from the lead frame 40 and the substrate 50 (not shown). In this event, the leads 25 can be separated from the lead frame 40, and the circuit boards 11 can be separated from the substrate 50, by punching using a pressing machine. Moreover, the connection parts 52 may be cut in edge surface portions of the sealing resin 14. Thus, exposed surfaces of the connection parts 52 and surfaces of the sealing resin 14 are set on the same level. Consequently, a configuration without protrusions can be realized.

In the above descriptions, each of the circuit boards 11 is separated after sealing the circuit boards 11. However, the sealing step may be performed after the circuit boards 11 are separated from the substrate 50.

According to the preferred embodiment of the present invention, the circuit device can be manufactured with a simplified step of aligning the leads with the respective pads on each of the circuit boards. Thus, manufacturing costs can be reduced. Specifically, in the present invention, a substrate having a number of circuit boards formed thereon is prepared. Moreover, a lead frame having a plurality of units formed thereon is prepared, each of the units including a predetermined number of leads. Furthermore, by superposing the lead frame on the substrate, pads on each of the circuit boards and ends of the corresponding leads included in the lead frame can be respectively aligned with each other. Accordingly, it is not necessary to perform individual alignment for each of the leads. Furthermore, jigs and the like for mechanically supporting the lead frame are not additionally needed. Thus, trouble incurred with aligning the leads can be significantly reduced, and the manufacturing costs can be reduced. Furthermore, alignment accuracy for the leads can be improved.

What is claimed is:

1. A method of manufacturing a circuit device in which electric circuits each including conductive patterns and circuit elements are mounted on surfaces of circuit boards, and in which leads are fixed respectively to pads each made of the conductive pattern, the method comprising the steps of:

preparing a substrate in which the plurality of the circuit boards are integrally connected to one another, each of the circuit boards having the conductive patterns which include the pads formed on the surface of the circuit board;

electrically connecting the circuit elements to the respective conductive patterns on each of the circuit boards;

positioning ends of the plurality of leads above the respective pads by superposing a lead frame including the leads on the substrate, and fixing the leads to the respective pads; and separating the circuit boards from the substrate in a state where the leads are fixed to the respective pad on each of the circuit boards, and separating the leads from the lead frame.

2. The method of manufacturing a circuit device according to claim 1, wherein, in the positioning and fixing step, the lead frame is superposed on the substrate, and the substrate and the lead frame are aligned with, and connected to, each other by fitting alignment pins into first alignment holes provided in a manner that the first alignment holes penetrate the lead frame, and by fitting the alignment pins into second alignment holes provided in a manner that the second alignment holes penetrate the substrate.

3. The method of manufacturing a circuit device according to claim 1, wherein the planar size of the substrate is substantially equal to that of the lead frame.

4. The method of manufacturing a circuit device according to claim 1, wherein, in the separating step, each of the circuit boards and the corresponding leads are separated from each other by punching.

5. The method of manufacturing a circuit device according to claim 1, wherein, in the positioning and fixing step, the lead frame is attached to the substrate with an insulating layer in a B stage state interposed therebetween, the insulating layer covering the surface of the substrate.

6. The method of manufacturing a circuit device according to claim 1, wherein at least the surfaces of the circuit boards are sealed in a state where the substrate and the lead frame are connected to each other.

* * * * *